United States Patent [19]

Hendrix

[11] Patent Number: 4,653,860

[45] Date of Patent: Mar. 31, 1987

[54] PROGRAMABLE MASK OR RETICLE WITH OPAQUE PORTIONS ON ELECTRODES

[75] Inventor: Joe R. Hendrix, South Lake, Tex.

[73] Assignee: Thomson Components-Mostek Corporation, Carrollton, Tex.

[21] Appl. No.: 689,255

[22] Filed: Jan. 7, 1985

[51] Int. Cl.[4] .............................................. G02F 1/133
[52] U.S. Cl. ...................................... 350/336; 350/333
[58] Field of Search ............... 350/333, 334, 336, 346, 350/342, 337, 349, 356, 339 R, 339 F

[56] References Cited

U.S. PATENT DOCUMENTS

| | | | |
|---|---|---|---|
| 3,761,171 | 9/1973 | Fields | 350/342 |
| 3,857,628 | 12/1974 | Strong | 350/337 |
| 3,900,248 | 8/1975 | Nagasaki | 350/349 |
| 4,021,798 | 8/1977 | Kojima | 350/336 |
| 4,112,333 | 9/1978 | Asars | 350/333 |
| 4,326,776 | 4/1982 | Banda | 350/333 |
| 4,373,784 | 2/1983 | Nonomura et al. | 350/336 |
| 4,386,836 | 7/1983 | Aoki et al. | 350/346 |
| 4,480,999 | 11/1984 | Spague | 350/356 |

OTHER PUBLICATIONS

"LCD Module Takes on CRTs", Electronic Products, Oct. 25, 1982, pp. 21–22.

Primary Examiner—John K. Corbin
Assistant Examiner—David Lewis
Attorney, Agent, or Firm—Roland Plottel

[57] ABSTRACT

A programable liquid crystal arrangement including parallel transparent plates and crossed, x-y addressable electrodes with a liquid crystal material disposed therebetween, in an optical system effective for fixing patterns or words of information in selected information storage media.

10 Claims, 3 Drawing Figures

PROGRAMABLE MASK OR RETICLE WITH OPAQUE PORTIONS ON ELECTRODES

TECHNICAL FIELD

This invention relates to the field of photolithography and more particularly to devices for controlling the patterned transmission of light to define specific material geometries in information storage materials such as photoresists.

BACKGROUND OF THE INVENTION

Information storage devices including for example ROM and gate array devices and photolithographic masters are frequently custom coded or customized for specific user application through masking and reticle techniques.

Such customizing in effect eliminates portions of a standard design and establishes the desired pattern or circuitry of a particular customer-specified scheme. Such techniques of custom coding generally change only the matrix portion of the standard design arrangement or geometry, with peripheral portions thereof remaining unchanged.

Present technology nonetheless requires changing the complete mask pattern for each particular user application which is custom coded. This involves a reticle or master fabrication cycle which is unnecessarily expensive and time consuming.

It is an object of the invention to avoid performance of an entire digitizing or photomask cycle each time a new pattern or geometry is to be established.

DISCLOSURE OF INVENTION

According to the invention, a programmable liquid crystal master or reticle is inserted in the light path of a direct wafer stepper or another projection image transfer device. The reticle comprises a liquid crystal programmable light-side panel and a hard pattern of opaque and transparent regions on the far-side panel to establish crisp resolving edges for the projected light pattern.

Thus, instead of having to make a new reticle or master for each new application, and having repeatedly to replace the reticle or master in the stepper or photolithographic device as changed mask or reticle patterns are required, which demands an extended cleaning and requalification time depending upon the particular fabrication system, a minor reprogramming change is all that needs to be implemented.

BEST MODE FOR CARRYING OUT THE INVENTION

Figure 1:
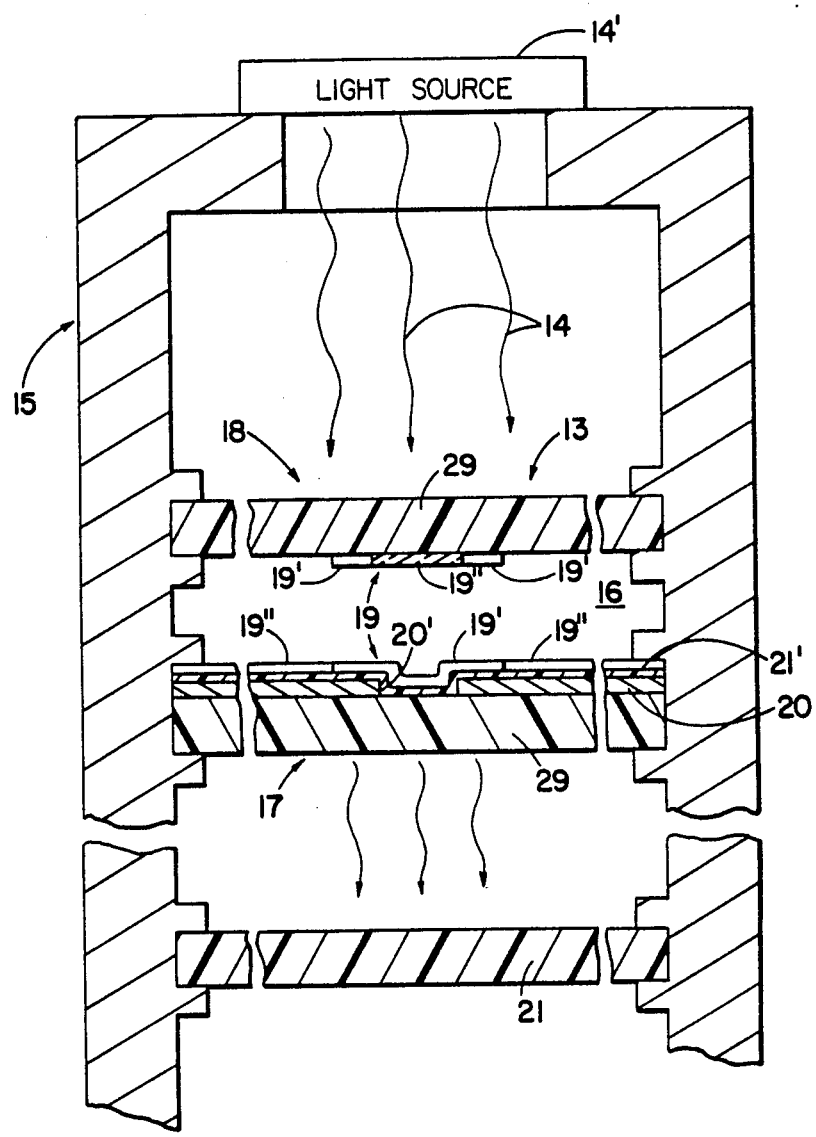
FIG. 1 is a cross-section of a stepper or imaging device for holding a mask or reticle according to the invention, including a side cross-section of a portion of the reticle to show the layers of material thin-film deposited thereupon.

As seen in FIG. 1, a programmable mask or reticle 13 for insertion in the light path 14 of a photolithographic imaging device or stepper 15 including lightsource 14' according to the invention addressed herein is preferably constructed of quartz glass for example arranged to sandwich a liquid crystal filler material 16.

Figure 2B:
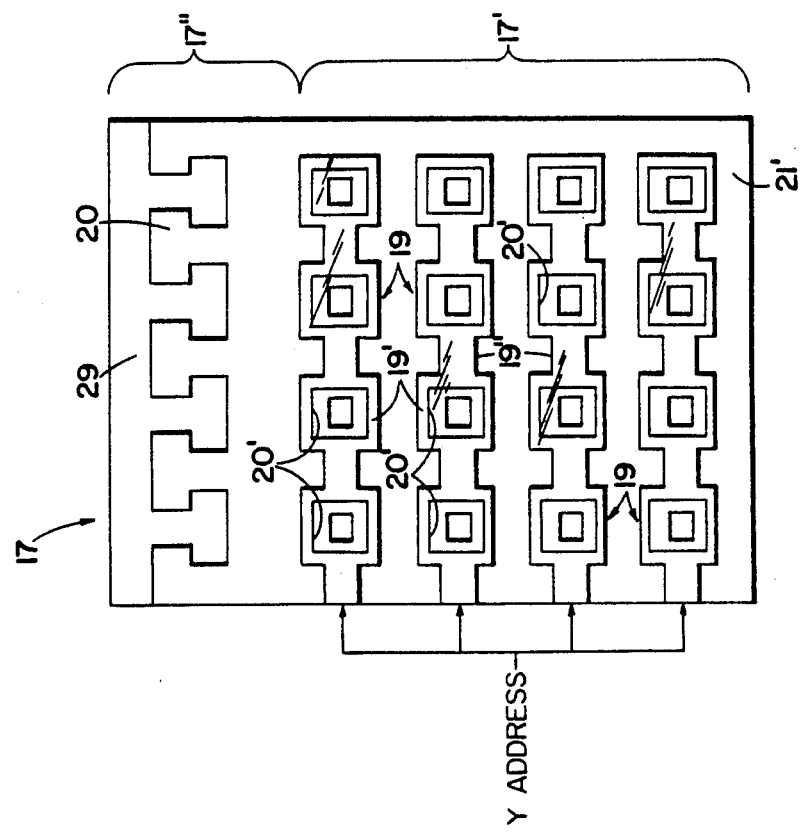
FIGS. 2A and 2B are respectively schematic drawings of the light-side and far-side panels of a programmable mask or reticle in accordance with the invention herein.
Figure 2A:
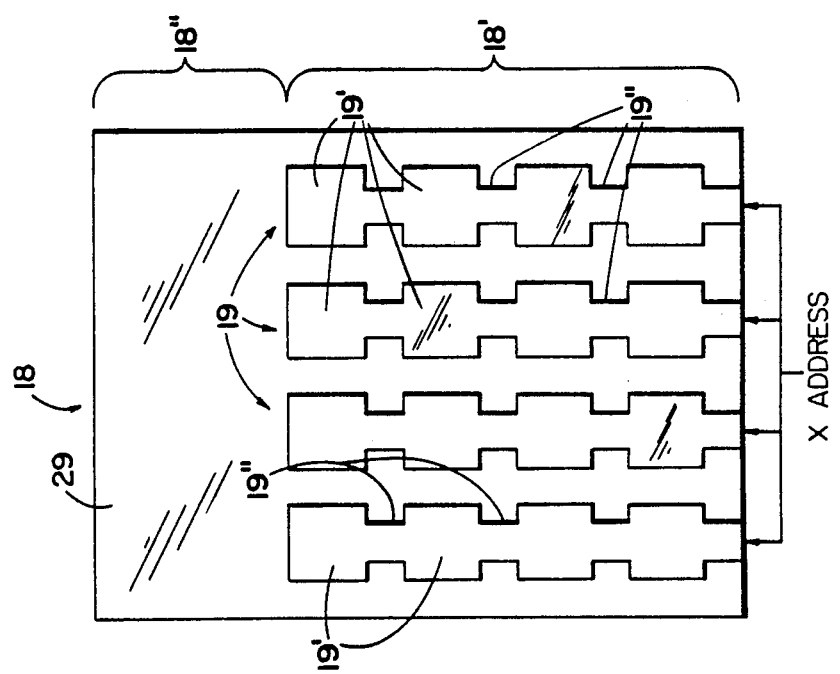

The mask or reticle 13 includes far-side and light-side panels, respectively 17 and 18, as seen in FIGS. 2A and 2B. The light-side and far-side panels 17 and 18 of the mask or reticle 13 include programmable (codable) and unprogrammable regions respectively 17' and 17", and 18' and 18" upon which the material of a transparent conductor 19 for example tin oxide is deposited. The programmable portions 17' and 18' of the reticle 13 thus include transparent conductors 19 including electrodes 19' and narrowed portions 19" of for example tin oxide on the inner faces of the light-side and far-side glass panels 17 and 18. Programmable regions 17' and 18' of the mask 13 are selectively made opaque and transparent by applying a suitable bias voltage across selected electrodes 19' straddling the liquid crystal material 16.

By shining light 14 through said mask or reticle 13, a light pattern can be cast upon a semiconductor wafer 21 or a portion thereof which is covered with photoresist or a similar material. The portion of this material which is under the mask and subject to light is accordingly hardened due to the exposure it receives. Subsequently, a suitable, well-known solvent material etches away the unhardened portion of the photoresist or similar material. Electrodes 19' are x-y addressable as suggested for example an article entitled "LCD Module Takes on CRTs" in the Oct. 12, 1982 issue of ELECTRONIC PRODUCTS (Hearst Business Communications; Garden City, N.Y.) at pg. 21. The article details, among other things, the availability of commercial thin-film liquid crystal modules with 24,576 pixels on a 2.65 by 3.97 inch area, and which additionally have an 8:1 contrast ratio. Contrast ratios of 20:1 are anticipated as are larger pixel numbers and module sizes. The liquid crystal module described in the article is driven by horizontal and vertical shift registers and latches operating under direction of a controller. Further, the respective shift registers are duly loaded from RAM memory, for example at a desired machine-limited rate. Multiplexing levels of up to 10,000 lines are thus feasible. Selective bias on VLSI-type masks or reticles 13 would require a low duty cycle refresh.

Since the optical density of the liquid crystal material 16 employed is directly proportional to the bias between electrodes 19' and the thickness of the liquid crystal material 16, a preferred separation between panels 17 and 18 is established and the voltage level between electrodes is at least 1.5 volts to insure sufficient light exclusion.

Edge-blooming, scattering and edge density effects are minimized by the crisp edges of a hard or fixed pattern 20 in far-side panel 17. Thus a high level of resolution is established according to this invention by combining hard patterning with liquid crystal biasing.

According to a preferred embodiment of the invention, a pair of spaced, parallel and transparent upper and lower panels 17 and 18 are subject to a selected pattern of electrodes 19' deposited on the respective inner surfaces of panels 17 and 18 in respective x and y directions.

In particular, FIG. 2B shows a schematic of the far-side panel 17 of the mask or reticle 13 in which a repetitive fixed or hard pattern 20 including perimeters bounding each of electrodes 19 are made of a suitable opaque material such as for example antireflective chrome.

Such a scheme involving antireflective chrome may in particular include a layer of chrome deposited upon substrate 29 in turn covered by a layer of chrome oxide. This oxide layer is light absorptive and effectively improves resolution.

These perimeters define the outer bounds of electrode cells 19, corresponding to widened portions 19' of conductors 19, in turn corresponding ones of electrodes 19' which can be addressed with selected high and low voltage levels to programmably set the liquid crystal material 16 therebetween in dark or transparent states. Other fixed patterns 20' can be provided on lower panel 17, which are associated with the programmable portion of the reticle 13 addressed herein.

Depending upon the conductivity of the opaque material used, the entire substrae 29 and the opaque hard patern 20 is covered by an insulative layer for electrically isolating the hard pattern 20 from electrodes 19. A preferred material for insulative layer is silicon oxide thin film deposited thereupon.

The narrow portions 19" associated with electrodes 19' in far-side panel 17 are underlain with portions of said opaque patterns 20, as seen in FIG. 1. This effectively prevents light passing through light-side panel 18 from passing through non-electrode portions of far-side panel 17.

Thus, when a given electrode 19' is cleared to pass light, only the electrode 19' and not the narrow portion 19" of conductor 19 passes light toward semiconductor 21 for imaging operation.

The substrates of upper and lower panels 17 and 18 are are preferably constructed of a material such as quartz glass. Alternatively, other suitable materials for constructing the respective substrates 19 include soda lime, borasilicate and white crown glass.

Panels 17 and 18 are complementary, in that the electrode regions of both panels are normally clear, but can be darkened by addressing particular complementary electrode pairs 19'.

Each of conductors 19 according to one embodiment thereof preferably defines for example an elongated pattern of narrow and widened portions, respectively 19' and 19". In any case, the electrodes 19' and conductors 19 are preferably thin-film deposited on the inner faces of respective panels 17 and 18 by a well known vacuum deposition technique.

FIGS. 2a and 2b show the substrates 29 of mask or reticle 13 including upper or light side panel 18 and lower or far side panel 17. Panel 18, as noted before, has conductor 19 suitably deposited thereupon. Panel 17 in turn has opaque fixed patterns 20 deposited thereupon to permit light to pass through only regions of panel 17 on which it is not deposited. The conductors 19 including electrodes 19' are in turn substantially transparently conductively coated over said fixed patterns 20.

The deposited electrodes 19' are made of a transparent material, such as for example tin oxide, or indium tin oxide.

The standard design geometry or pattern to be programmed on the light-side panel is typically stored in a customer-supplied EPROM.

The above may lead others skilled in the art to conceive of other embodiments, which are nonetheless within the scope of the invention. It is accordingly urged that reference be taken to the claims which follow, as those define the metes and bounds of the invention with particularity.

I claim:

1. A liquid crystal mask, capable for use in an optical system effective for imagewise exposing photoresists, said mask comprising first and second spaced parallel transparent plate means for supporting thin film deposition of selected materials; respective first and second arrays of parallel, transparent and independently electrically addressable electrodes, said electrodes being thin film deposited with respect to the inner faces of said respective first and second plate means, said respective plate means arranged such that the electrodes in said first array are generally perpendicular to the electrodes in said second array; said second plate having deposited on each electrode a plurality of portions of permanently opaque material each portion having only one opening and each not in contact with other portions of permanently opaque material and each disposed about the periphery of said electrodes so as to form a plurality of spaced transparent openings along and within the length of the electrodes thereon; and liquid crystal material maintained between said respective plate means, whereby the selective voltage addressing of particular crossed pairs of electrodes in said first and second plate means causes a potential difference therebetween, which darkens an adjacent region of said liquid crystal material.

2. The mask of claim 1, wherein each of said electrodes defines a series of spaced, widened portions, and each widened electrode portion in said first plate corresponding to a widened electrode portion in said second plate.

3. The mask of claim 2, wherein said second plate means has a permanently opaque pattern around the periphery of each widened portion for preventing the transmission of light therethrough.

4. The mask of claim 2 further comprising a transparent insulating material between said electrodes and said permanently opaque material.

5. The mask of claim 3 further comprising a transparent insulating material between said electrodes and said permanently opaque material.

6. An imaging device suitable for exposing a photoresist which comprises:
   (a) a liquid crystal mask, capable of selectively imagewise exposing photoresists by means of a suitable light source directed therethrough, said mask comprising first and second spaced parallel transparent plate means for supporting thin film deposition of selected materials; respective first and second arrays of parallel, transparent and independently electrically addressable electrodes, said electrodes being thin film deposited with respect to the inner faces of said respective first and second plate means, said respective plate means arranged such that the electrodes in said first array are generally perpendicular to the electrodes in said second array; said second plate having deposited on each electrode a plurality of portions of permanently opaque material each portion having only one opening and each not in contact with other portions of permanently opaque material and each disposed about the periphery of said electrodes so as to form a plurality of spaced transparent openings along and within the length of the electrodes thereon; and liquid crystal material maintained between said respective plate means, whereby the selective voltage addressing of particular crossed pairs of electrodes in said first and second plate means causes a potential difference therebetween, which darkens an adjacent region of said liquid crystal material; and (b) means for conducting a light source through said mask.

7. The device of claim 6, wherein each of said electrodes defines a series of spaced, widened portions, and each widened electrode portion in said first plate corresponding to a widened electrode portion in said second plate.

8. The device of claim 7, wherein said second plate means has a permanently opaque pattern around the periphery of each widened portion for preventing the transmission of light therethrough.

9. A method for treating a photoresist which comprises:

(a) providing a semiconductor wafer having a photoresist material coated thereon; and (b) providing a liquid crystal mask, capable of selectively imagewise exposing photoresists by means of a suitable light source directed therethrough, said mask comprising first and second spaced parallel transparent plate means for supporting thin film deposition of selected materials; respective first and second arrays of parallel, transparent and independently electrically addressable electrodes, said electrodes being thin film deposited with respect to the inner faces of said respective first and second plate means, said respective plate means arranged such that the electrodes in said first array are generally perpendicular to the electrodes in said second array; said second plate having deposited on each electrode a plurality of a portions of permanently opaque material each portion having only one opening and each not in contact with other portions of permanently opaque material and each disposed about the periphery of said electrodes so as to form a plurality of spaced transparent openings along and within the length of the electrodes thereon; and liquid crystal material maintained between said respective plate means, whereby the selective voltage addressing of particular crossed pairs of electrodes in said first and second plate means causes a potential difference therebetween, which darkens an adjacent region of said liquid crystal material; and (c) conducting a light source through said mask thereby casting an image upon the photoresist material; and (d) etching away the non-image portion of the photoresist.

10. The method of claim 9, wherein each of said electrodes defines a series of spaced, widened portions, and each widened electrode portion in said first plate corresponding to a widened electrode portion in said second plate and wherein said second plate means has a permanently opaque pattern around the periphery of each widened portion for preventing the transmission of light therethrough.

* * * * *